US008477828B2

(12) United States Patent
Schmid

(10) Patent No.: US 8,477,828 B2
(45) Date of Patent: Jul. 2, 2013

(54) ADAPTIVE CORRELATION FOR DETECTION OF A HIGH-FREQUENCY SIGNAL

(75) Inventor: Andreas Schmid, Duisburg (DE)

(73) Assignee: Infineon Technologies AG, Neubiberg (DE)

( * ) Notice: Subject to any disclaimer, the term of this patent is extended or adjusted under 35 U.S.C. 154(b) by 1145 days.

(21) Appl. No.: 12/326,669

(22) Filed: Dec. 2, 2008

(65) Prior Publication Data

US 2010/0135367 A1 Jun. 3, 2010

(51) Int. Cl.
*H04B 1/00* (2006.01)
(52) U.S. Cl.
USPC ........... 375/147; 375/146; 375/140; 375/130; 370/319; 370/320; 370/321; 370/330; 370/335; 370/342; 370/345; 370/347
(58) Field of Classification Search
USPC .................. 375/147, 146, 140, 130; 370/319, 370/320, 321, 330, 335, 342, 345, 347
See application file for complete search history.

(56) References Cited

U.S. PATENT DOCUMENTS

| | | | |
|---|---|---|---|
| 4,894,662 A * | 1/1990 | Counselman | 342/357.25 |
| 6,201,497 B1 | 3/2001 | Snyder et al. | |
| 6,411,811 B2 | 6/2002 | Kingdon et al. | |
| 6,661,371 B2 | 12/2003 | King et al. | |
| 6,728,301 B1 * | 4/2004 | Chrisikos | 375/147 |
| 7,382,315 B1 | 6/2008 | Stevens et al. | |
| 2002/0181626 A1 * | 12/2002 | Sung | 375/347 |
| 2004/0214538 A1 * | 10/2004 | Ballantyne et al. | 455/141 |
| 2006/0262835 A1 * | 11/2006 | Schmid et al. | 375/148 |
| 2008/0130729 A1 * | 6/2008 | Chapman et al. | 375/226 |

OTHER PUBLICATIONS

Lachapelle, G., "GNSS Indoor Location Technologies", Journal of Global Positioning Systems, 2004, vol. 3, No. 1-2, pp. 2-11.
Schmid, A., et al., "Differential Correlation for Galileo/GPS Receivers", IEEE International Conference on Acoustics, Speech, and Signal Processing, Mar. 18-23, 2005, pp. III/953-III/956, vol. 3.
Schmid, A., et al., "Performance Evaluation of Differential Correlation for Single Shot Measurement Positioning", ION GNSS, 17th International Technical Meeting of the Satellite Division, Sep. 21-24, 2004, pp. 1998-2009.
Schmid, A., et al., "Galileo/GPS Receiver Fixed-Point Implementation using Conventional and Differential Correlation", ION GNSS, 18th International Technical Meeting of the Satellite Division, Sep. 13-16, 2005, pp. 1945-1956.
Zheng, B., et al., "GPS Software Receiver Enhancements for Indoor Use", Proceedings of ION GNSS (Session C3), Sep. 13-16, 2005, pp. 1-5.
Schmid, A., et al., "Combined Galileo/GPS Architecture for Enhanced Sensitivity Reception", International Journal of Electronics and Communications, vol. 59, Apr. 19, 2005, pp. 297-306.
Kovář, P., et al., "Augmentation Methods for GNSS Integrity and Precision Enhancement in Difficult Environment", ENC-GNSS 2007, European Navigation Conference, May 29-31, 2007, Geneva, Switzerland, pp. 107-114.

(Continued)

*Primary Examiner* — Zewdu Kassa
(74) *Attorney, Agent, or Firm* — Slater & Matsil, L.L.P.

(57) ABSTRACT

Embodiments related to acquisition, detection, and processing of a high-frequency signal are described and depicted.

20 Claims, 3 Drawing Sheets

OTHER PUBLICATIONS

Schmid, A., et al., "A combined Galileo/GPS Receiver Architecture for Consumer Market Applications", 2004, 8 pages.

Avila-Rodriguez, J.A., et al., "How to Optimize GNSS Signals and Codes for Indoor Positioning", ION GNSS 19$^{th}$ International Technical Meeting of the Satellite Division, Sep. 2006, Munich, 9 pages.

Skournetou, D., et al., "Indoor Location Awareness Based on the Non-Coherent Correlation Function for GNSS Signals", Finnish Signal Processing Symposium, FINSIG 2007, Oulu, Finland, Aug. 30, 2007, 6 pages.

Ioannides, R., et al., "Coherent Integration of Future GNSS Signals", 19$^{th}$ International Technical Meeting of the ION GNSS, Sep. 26-29, 2006, pp. 1253-1268.

Shanmugam, S., et al., "Design of Short Synchronization Codes for Use in Future GNSS System", International Journal of Navigation and Observation, Article ID 246703, vol. 2008, Feb. 7, 2008 Hindawi Publishing Corporation, 14 pages.

Gaggero, P.O., et al., "Ultra-stable Oscillators: Limits of GNSS Coherent Integration", ION GNSS Conference, Session $A2_B$, Sep. 16-19, 2008, pp. 1-11.

* cited by examiner

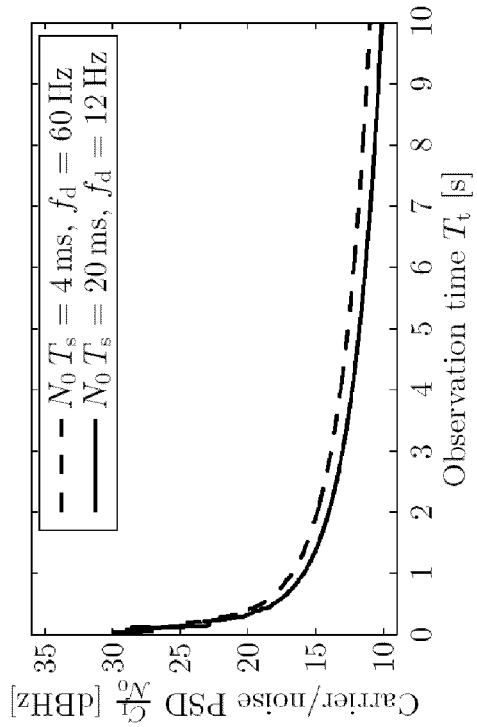
Figure 2B Galileo E1-C
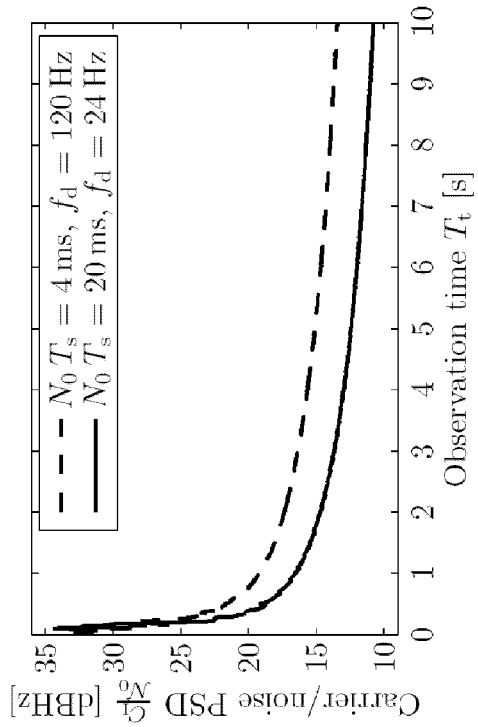
Figure 2D Galileo E1-C
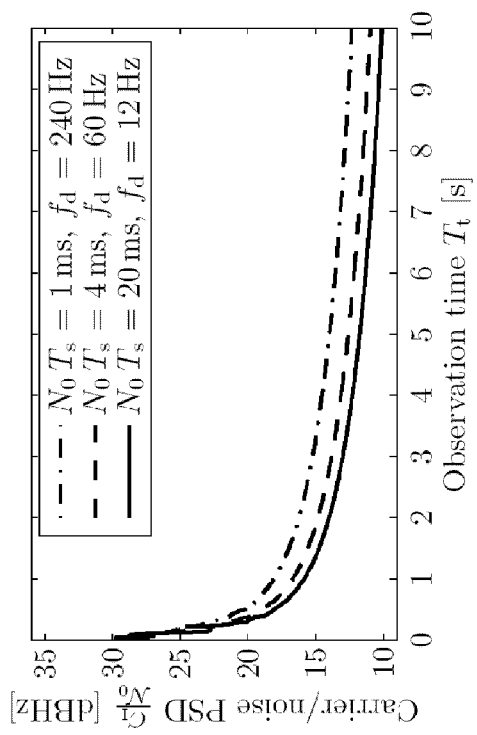
Figure 2A GPS L1-C/A
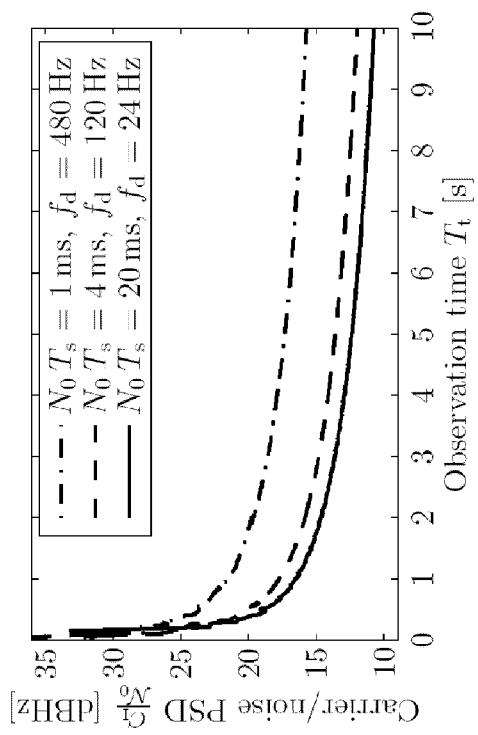
Figure 2C GPS L1-C/A

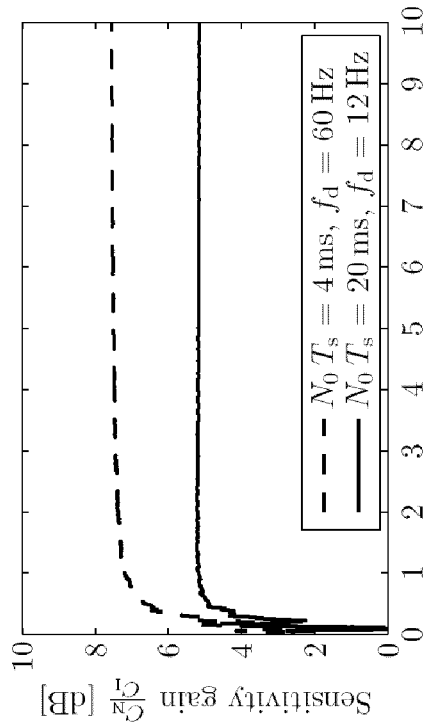
Figure 3A GPS L1-C/A
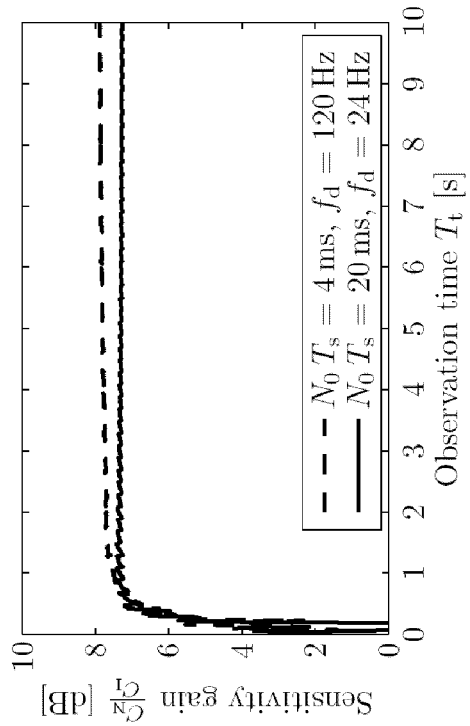
Figure 3C GPS L1-C/A
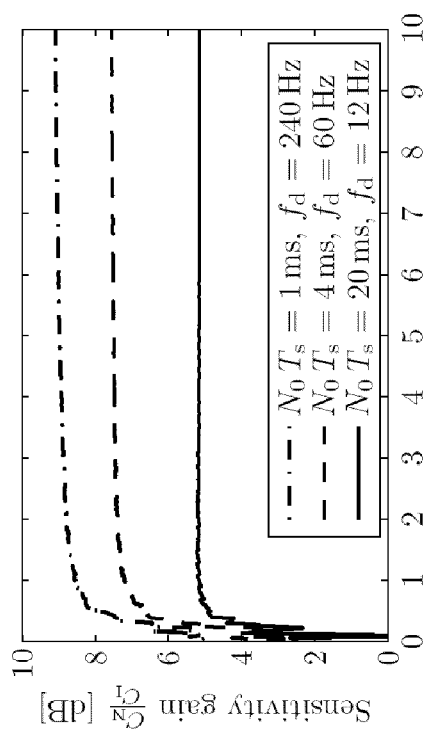
Figure 3B Galileo E1-C
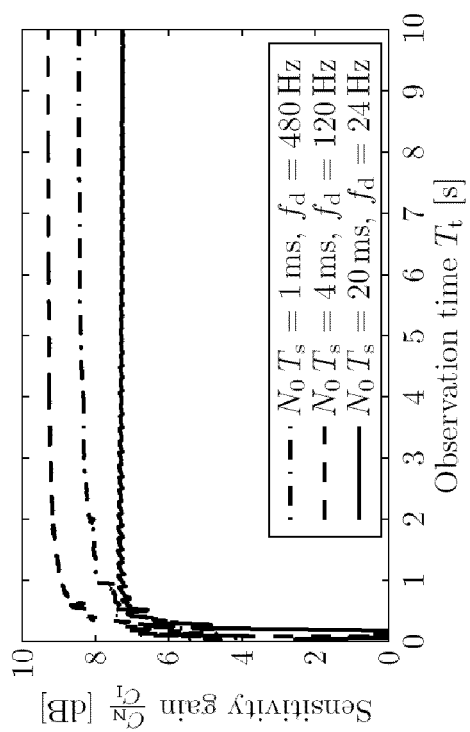
Figure 3D Galileo E1-C

ADAPTIVE CORRELATION FOR DETECTION OF A HIGH-FREQUENCY SIGNAL

TECHNICAL FIELD

An embodiment of the invention relates generally to a receiver for processing and detection of a high-frequency received signal, such as a satellite navigation signal, and a related method.

BACKGROUND

Satellite navigation has become a prerequisite for a wide range of electronic positioning devices that include products intended for vehicular and portable applications. As a result, deep urban and indoor areas are becoming increasingly important for emerging satellite navigation designs. Attenuation, shadowing, and multipath fading effects in urban canyons and indoor areas frequently degrade the received satellite navigation signals. Signal obstructions in these environments often lead to limited service availability.

A navigation system in use today for determining a position of a mobile radio receiver may utilize the satellite-based GPS system, and in the near future, the European Galileo system. The terms "GPS" and "Galileo" are used interchangeably herein. Both systems work similarly, each employing about 24 to 31 orbiting satellites, each satellite with accurately known position and time that transmit a signal with a time stamp that indicates when the signal was sent from the satellite. In order to be able to compute the position of the mobile receiver, satellite clocks in each system are accurately synchronized to a common time reference. The mobile receiver calculates its position by the following (simplified) steps: First the time stamp of at least four satellites is extracted from received signals by the mobile receiver, and the time of arrival of the time-stamped message is recorded. The distance from each satellite to the mobile receiver is calculated by comparing the respective time stamp with its arrival time, using the accurately known propagation velocity of the radio signal. The position of each satellite can be accurately determined at any instant in time by the mobile receiver using satellite ephemeris data, which is regularly updated and transmitted by the satellites. Thus, the distance to at least three of the satellites can be calculated by the mobile receiver position using triangulation. However, the clock in the mobile receiver may not be accurately synchronized with the synchronized clocks in the satellites. A time-stamped signal received from a fourth satellite by the mobile receiver is generally used to compensate clock uncertainty in the mobile receiver. To improve accuracy even further in determining the location of the mobile receiver, perturbation effects operative on the received signal such as atmospheric effects, earth rotation, relativity, etc., are typically included in the computation of the mobile receiver location.

GPS satellites transmit on carrier frequencies of 1.57542 GHz (for the GPS L1 signal) and 1.2276 GHz (for the GPS L2 signal). The GPS carrier is modulated with a spread-spectrum technique employing a pseudorandom code with a bit rate of about 1 Mchip/s (1.023 Mchip/s) for the coarse acquisition ("C/A") GPS code, and 10.23 Mchip/s for the precise (P) GPS code. Thus, roughly 100-2000 carrier cycles, depending on the GPS signal, comprise one spread-spectrum chip. Since the speed of light (in a vacuum) is about 299,792,458 m/s, the "length" of one chip at 1 Mchip/s is about 300 m, and at 10 Mchip/s, about 30 m. This means that in order to obtain good accuracy in the position computation, the arrival time must be determined by the mobile receiver within a reasonably small fraction of a chip. Existing products are able to determine position with accuracy well better than 10 m when there is sufficiently high signal-to-noise ratio, confirming that it is possible to determine the time of arrival of the received signal with high accuracy.

Practical satellite navigation applications thus require Galileo/GPS receivers with high positioning accuracy at low signal-to-noise ratio. This is particularly the case for applications in deep urban and indoor environments where envelopes of buildings and vehicles attenuate the signals transmitted by the satellites, which are already quite weak at about −158.5 dBW when unobstructively received on the earth's surface. The result is a degrading of positioning accuracy in urban and indoor environments in view of user expectations or system requirements.

Enhanced reception sensitivity is a key success factor for satellite navigation in the mass consumer market. Galileo/GPS receivers with higher reception sensitivity would enable more widespread utilization of satellite navigation.

Thus, the design of an improved Galileo/GPS receiver that provides improved signal detection and, correspondingly, improved positioning availability and accuracy, particularly in an environment of low received signal-to-noise ratio, would address an unanswered application need.

SUMMARY OF THE INVENTION

In accordance with an exemplary embodiment, a receiver configured to coherently integrate a received signal, which may be a CDMA signal, in a coherent integration stage over a first period of integration and a related method are provided. In an embodiment, the receiver is a global navigation satellite system receiver such as a GPS or a Galileo receiver. In an embodiment, the coherent integration stage of the receiver employs a downconverted signal that may be a baseband signal to produce a pre-detection sample. A phase error signal dependent on a phase error of the pre-detection sample is produced in a phase error detection stage coupled to the coherent integration stage. A downconversion frequency adjustment signal is produced from the phase error signal in a correction stage that is coupled to the phase error detection stage. In a further embodiment, the receiver includes a detection stage coupled to the coherent integration stage. In an embodiment, the phase error detection stage is configured to delay a plurality of the pre-detection samples, form a complex conjugate of the plurality of the delayed pre-detection samples, form a sum of products over a second period of integration of the plurality of the pre-detection samples with the plurality of the delayed and complex conjugated pre-detection samples, and produce the phase error signal dependent on an angular coordinate of the sum of products. In an embodiment, the delayed pre-detection samples of the plurality of delayed pre-detection samples are each delayed by the first period of integration of the coherent integration stage. The detection stage is configured to produce a decision statistic from the pre-detection sample. In an embodiment, a sequence of magnitudes is formed in the detection stage from the sum of products, and the sequence of magnitudes is summed to form the decision statistic. In an embodiment, the correction stage employs the phase error signal to adjust at least one of a duration of the first period of integration and a duration of the second period of integration. In a further embodiment, a signal downconverter stage, that may be a baseband signal downconverter stage, employs a downconversion signal having a downconversion frequency and a despreading code to produce a downconverted baseband signal.

In a further exemplary embodiment, a receiver, that may be a global navigation satellite system receiver such as a GPS or a Galileo receiver, includes a coherent integration stage configured to coherently integrate a received signal over a first period of integration to produce a pre-detection sample. The pre-detection sample is employed to adjust a duration of the first period of integration during acquisition of the received signal. In an embodiment, the receiver further includes a detection stage coupled to the coherent integration stage. In an embodiment, the receiver is further configured to delay a plurality of the pre-detection samples, form a complex conjugate of the plurality of the delayed pre-detection samples, form a sum of products over a second period of integration of the plurality of the pre-detection samples with the plurality of the delayed and complex conjugated pre-detection samples, and produce a phase error signal dependent on an angular coordinate of the sum of products. The phase error signal is employed to adjust the first period of integration during the acquisition of the received signal. In an embodiment, the delayed pre-detection samples of the plurality of delayed pre-detection samples are each delayed by the first period of integration of the coherent integration stage. The detection stage is configured to produce a decision statistic employing the pre-detection sample. In an embodiment, a sequence of magnitudes is formed in the detection stage from the sum of products, and the sequence of magnitudes is summed to form the decision statistic. In an embodiment, the summed sequence of magnitudes is squared to form the decision statistic. In an embodiment, the receiver is further configured to adjust at least one of the first period of, integration and the second period of integration employing the phase error signal. In a further embodiment, the receiver includes a baseband signal downconverter stage. The baseband signal downconverter stage is configured to produce a downconverted baseband signal employing a downconversion signal characterized by a downconversion frequency, wherein the downconverted baseband signal comprises the received signal. The pre-detection sample is further employed to adjust the downconversion frequency. In an embodiment, the baseband signal downconverter stage employs a despreading code.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, and may be described only once in the interest of brevity. For a more complete understanding of the invention, reference is now made to the following descriptions taken in conjunction with the accompanying drawings, in which:

FIGS. 2A-2D illustrate graphs showing reception sensitivity for the adaptive integration technique versus observation time for a receiver constructed according to an embodiment; and FIGS. 3A-3D illustrate graphs showing sensitivity gain versus observation time of the adaptive correlation technique for a receiver constructed according to an embodiment versus a state-of-the-art noncoherent receiver.

DETAILED DESCRIPTION OF ILLUSTRATIVE EMBODIMENTS

Figure 1:
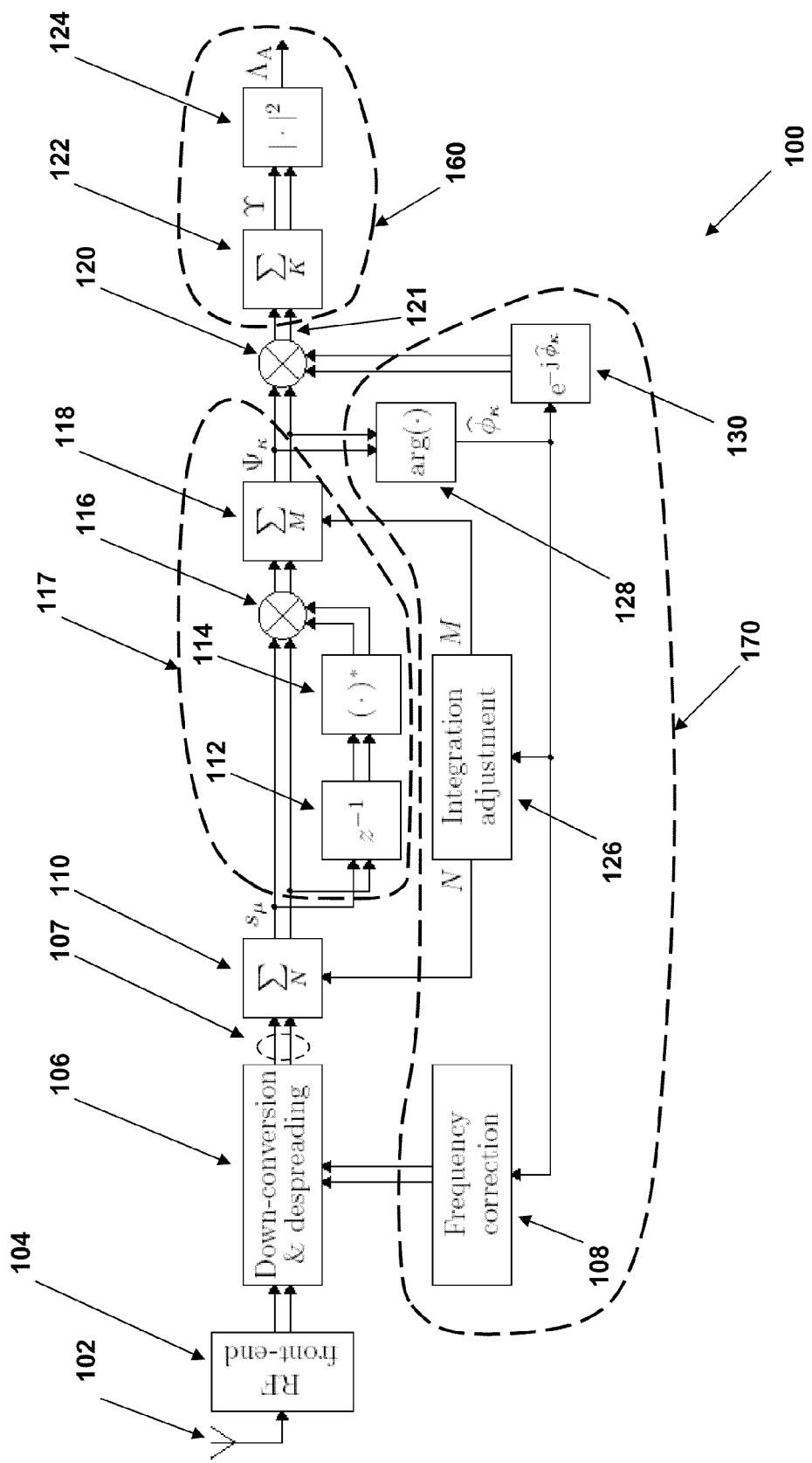
FIG. 1 illustrates a signal flow diagram for a receiver with adaptive correlation, constructed according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a process and method to provide improved signal detection capability for an RF (radio frequency) signal such as a GPS or Galileo satellite signal.

An embodiment of the invention may be applied to various signal-detection arrangements in a high-frequency receiver, for example, to a cellular telephone receiver. Other signal-detection arrangements can be constructed and applied using processes introduced herein in different contexts using inventive concepts described herein, for example, a signal detection arrangement employed to detect a high-frequency modulated carrier signal that might be transmitted over an air or a hard-wired channel to a receiver in a local area network or to a television broadcast receiver.

A long coherent integration period for signal detection in a GPS/Galileo receiver leads to higher reception sensitivity. High reception sensitivity is important for positioning accuracy in an environment with a low signal-to-noise ratio. Reception sensitivity can be enhanced by about 3 dB when the period of coherent integration is doubled. The maximum coherent integration period is, however, limited by the frequency offset between a local oscillator frequency signal employed for downconversion in the GPS receiver and the frequency of the received carrier.

Coherent integration refers to processing both the magnitude and phase of a received signal. Coherent integration can be performed by separately integrating signed real and imaginary components of a signal represented in the complex plane, for example, by separately integrating signed in-phase and quadrature signal components. The received signal may be coherently integrated over a limited period of time after downconversion to baseband using a local oscillator that may have a frequency imprecisely tuned to the received carrier frequency of the transmitter. For example, the local oscillator may have a frequency selected from a frequency search table that is used in the process of acquiring a received GPS signal.

The term coherent integration may include processing of a signal with a "multiply and accumulate" process, wherein a function representing an inverse characteristic of a spread spectrum modulation is multiplied with a received signal. The inverse characteristic may include an inverse of a time response of a filter at either end of the communication path or an inverse characteristic of the communication path between a satellite and the receiver. The multiplication may include multiplication by a function with a complex value, such as a complex-valued modulating signal constellation. A matched filter as generally used in a receiver may also provide a coherent integration process. Systems that employ coherent integration include, without limitation, satellite navigation receivers, mobile communication receivers, satellite communication receivers, local area network receivers, and radio and television receivers.

Signal acquisition is the first step for measuring a GPS receiver position. A GPS receiver performs a grid search for the frequency and the code phase of a received signal, the resolution of which is typically limited to a pre-determined code phase and frequency search bin size. The size of each frequency search bin is inversely proportional to the coherent integration time. With increased coherent integration time, the correlation peak becomes narrower in the frequency dimension. Thus, doubling the coherent integration time doubles the number of frequency search bins, which either increases the time-to-fix, or doubles the required number of parallel correlation channels.

For positioning in deep urban and moderate indoor environments where enhanced reception sensitivity is a prerequisite for a signal that is only about −158.5 dBW in an unobstructed environment, noncoherent integration has become the state-of-the-art signal detection technique. Noncoherent integration generally refers to processing only the magnitude of a received signal. As opposed to very long coherent integration intervals which require accurate matching of the frequency of the local oscillator with the frequency of the received carrier, noncoherent integration can sustain a certain degree of local oscillator frequency deviation.

However, a drawback of noncoherent integration is that it cannot improve the reception sensitivity as efficiently as coherent integration. Doubling a noncoherent integration period can improve the reception sensitivity by around 1.5 dB. Doubling a coherent integration period, on the other hand, improves reception sensitivity by 3 dB. This is a significant drawback of noncoherent integration, since extended noncoherent integration delivers only half the gain of comparably extended coherent integration.

As introduced herein, a new correlation technique improves GPS signal detection capability, and correspondingly, improves positioning availability. The enhancement provides a new signal correlation process to estimate, with little effort, the residual Doppler frequency offset of a local oscillator. This in turn allows for an incremental and progressive reduction of the frequency offset during the correlation interval. The frequency adjustment produces compensated phase fluctuations in the correlation function. The incrementally and progressively reduced frequency offset allows incremental extension of coherent integration intervals, which substantially improves the processed signal strength.

The new solution can be employed as a replacement for noncoherent integration in a GPS, cellular, or other high-frequency signal receiver. Instead of squaring the coherently integrated pre-detection samples, it multiplies, in an embodiment, each sample with the complex conjugate of a previous sample. The phase error between these samples is directly proportional to the residual frequency deviation. The phase error can be sensed by building and appropriately scaling the argument of these samples. The resulting estimated residual frequency deviation is then fed back to the down-conversion mixer to reduce the frequency deviation of the continuing detection process. Hence, the residual frequency deviation is incrementally and progressively reduced, even during initial signal acquisition.

This mechanism to reduce frequency deviation can be distinguished from a frequency-locked loop (FLL) or phase-locked loop (PLL). These two techniques require prior signal acquisition, and operate during a signal-tracking mode. However, the process introduced herein is operable prior to signal acquisition. Simulations and calculations described hereinbelow show that frequency deviation is incrementally and progressively reduced as introduced herein even before sufficient signal energy has been integrated to allow reliable acquisition detection.

The incremental reduction of the frequency deviation, however, leads to the phase of the intermediate correlation samples to incrementally and progressively rotate to zero. If these samples were integrated directly without progressive correction, the phase rotation would reduce reception sensitivity. A receiver constructed according to an embodiment contains an additional phase rotation process that counteracts this effect.

Since the residual frequency deviation is progressively reduced, the coherent integration period can be extended accordingly, which substantially enhances signal reception sensitivity. In order to maximize reception sensitivity, a controller tracks the current frequency deviation and adjusts the coherent integration period such that the two are optimally aligned to each other.

Turning now to FIG. 1, illustrated is a signal flow diagram 100 for a receiver with an adaptive correlation process, constructed according to an embodiment. First, the flow of signals in FIG. 1 will be described, which will then be followed later hereinbelow with a more mathematical description of the signal processing steps.

A satellite signal, which is a direct sequence spread spectrum signal, is received by antenna 102 and then amplified and filtered by RF front end 104. The resulting RF signal is then downconverted and despread in down-conversion and despreading block 106 to produce a complex (sampled) digital baseband signal 107. The down-conversion and despreading block 106 forms a baseband signal downconverter stage configured to produce downconverted baseband signals corresponding to a frequency of a local oscillator (not shown) contained therein. Alternatively, the local oscillator may be located in a separate device, such as a separate integrated circuit, with its output signal coupled to the down-conversion and despreading block. A local oscillator may be implemented as a digital process as is known in the art, such as an NCO ("numerically controlled oscillator"). Down-conversion and despreading block 106 typically employs analog-to-digital conversion to produce a digital signal with a sampling time step $T_s$.

The next signal-processing stage is coherent integration stage 110. In coherent integration stage 110, summation of the complex signal components implements a coherent integration process. The period of summation represented by the parameter N is dependent on the temporal coherence of the summed components, and is limited by the accuracy of the local oscillator frequency with respect to the frequency of the received signal as well as other factors, such as the granularity of the frequency search space, that may contribute to a frequency variation between the signal received by the receiver and the frequency of the local oscillator in the receiver. Even for a relatively accurate local oscillator frequency, both real and imaginary components are produced by this summation process, for example, due to any remaining local oscillator frequency offset and signal modulation.

The output of coherent integration stage 110, which represents a coherently integrated signal, referred to herein as pre-detection samples $s_\mu$, is then processed in phase error detection stage 117. In phase error detection stage 117, each pre-detection sample is delayed by one sampling time step (with reference to the summation performed in coherent integration stage 110, i.e., the delay is $T_s \cdot N$) by delay element 112, and the complex conjugate thereof is formed in block 114. The output of block 114 is multiplied by the current output of coherent integration stage 110 in multiplier 116.

The sequence of complex products produced by multiplier 116 are summed in summer 118 to produce an intermediate correlation result, shown as the complex-valued parameter $\Psi_\kappa$. The integer M in block 118 represents the number of products that are accumulated over a summation interval. In correction stage 170, the argument, i.e., an angular coordinate, of the intermediate correlation result $\Psi_\kappa$ is formed in block 128. The argument of the intermediate correlation result $\Psi_\kappa$ is converted in block 130 to a complex number of unit magnitude. The unit-magnitude complex number produced in block 130 is multiplied with the output of block 118 in multiplier 120 to form the product 121. Recalling that the product of a complex number and its conjugate is always a scalar, the signal 121, subject to accuracy of the computation and delays, is a scalar result. The signal 121 is illustrated in FIG. 1 with two lines to recognize that the multiplication and other numerical steps performed in multiplier 120 might produce a small imaginary component in the product that may be optionally omitted in further signal-processing steps.

The next signal-processing stage is detection stage 160. In detection stage 160, the products 121 are summed in summer 122 to produce a final correlation result, the signal Y that is ideally a scalar, but may include a small imaginary component that can be omitted, again due to accuracy of a previous processing step. The signal Y (or its magnitude) may be employed as a decision statistic for the received signal. Alternatively, block 124 may be optionally included in the signal-processing sequence to square the magnitude of Y to produce a decision statistic for the received signal.

The argument (i.e., the angular coordinate of the complex number) of the intermediate correlation result $\Psi_\kappa$ formed in block 128 represents a phase error in the adaptive correlation process due to variation of the frequency of the local oscillator with respect to the frequency of the received signal. This phase error is employed in correction stage 170 to progressively adapt parameters of the receiver, such as the frequency of the local oscillator, to characteristics of the received signal. The phase error produced in block 128 is employed to adjust the integers N and M that control the range of summations in blocks 110 and 118, as well as its use in frequency correction block 108 to adjust the frequency of the local oscillator employed in the down-conversion and despreading processes in block 106. The ranges of summations in blocks 110 and 118 correspond to durations of respective periods of integration associated with these summation processes.

In order to quantify the resulting sensitivity enhancement, the probability density function of the adaptive integration result is now described with continuing reference to FIG. 1. The first steps, downconversion, despreading, and coherent integration, yield the pre-detection samples $s_\mu$ produced in coherent integration stage 110 as illustrated in FIG. 1:

$$s_\mu = y_\mu + w_\mu \approx \sqrt{2C}\; d_{s,\mu}\; R(\tau - \hat{\tau}) \operatorname{sinc}(f_{d,\mu}\; N_\mu\; T_s) e^{j(2\pi f_{d,\mu}[(\mu+1/2)N_\mu T_s + \tau] + \phi_c)} + w_\mu,$$

In the equation above, the parameter C denotes the carrier power, $d_{s,\mu}$ the resampled received data stream, $R(\tau - \hat{\tau})$ the correlation function of the spreading code, $\tau$ the actual spreading code phase, $\hat{\tau}$ the estimated code phase in the receiver, $f_{d,\mu}$ the frequency deviation between down-conversion frequency and carrier frequency, $N_\mu$ the coherent integration number, $T_s$ the sample period, $w_\mu$ the white Gaussian noise samples, and $\mu$ the sample index after summation in block 110. The pre-detection noise $w_\mu$ has variance $$\sigma_w^2 = E\{|w|^2\} = 2\; E\{\Re\{w\}^2\} = 2\; E\{\Im\{w\}^2\} = 2\; N\; kT_0 B F$$

with $k = 1.381 \times 10^{23}$ Ws/K representing the Boltzmann constant, $T_0$ the receiver noise temperature, B the noise bandwidth, and F the front-end receiver noise figure.

The next step is adaptive correlation, which multiplies each pre-detection sample $s_\mu$ with the complex conjugate of the previously pre-detected sample $s_{\mu-1}$, to produce the product produced in block 116. The intermediate correlation result is the parameter $\Psi_\kappa$ produced in block 118

$$\Psi_\kappa = \sum_{\mu = W_\kappa}^{W_{\kappa+1}-1} s_\mu \cdot s_{\mu-1}^*$$

that is formed by accumulation of these products. The cumulative intermediate correlation number is calculated as $$W_{\kappa+1} = W_\kappa + M_\kappa,\quad W_0 = 0,$$

where $M_\kappa$ represents the number of products that are accumulated in each interval $\kappa$. The intermediate correlation result $\Psi_\kappa$ converges to a complex-valued, nonzero-mean Gaussian distributed variable. This approximation with the Central Limit Theorem holds with sufficient accuracy roughly for $M_\kappa > 10$. The resulting variance can be derived to be $$\sigma_{\Psi_\kappa}^2 = E\{|\Psi_\kappa - E\{\Psi_\kappa\}|^2\} = (M_\kappa - 1)\sigma_w^4 + 4(M_\kappa - 1)\sigma_w^2\, C\, R^2(\tau - \hat{\tau}) \operatorname{sinc}^2(f_{d,\kappa}\, N_\kappa\, T_s)$$

The value $m_{\Psi_\kappa}$, which is the expected value of $\Psi_\kappa$, can be computed using the equation $$m_{\Psi_\kappa} = E\{\Psi_\kappa\} = 2(M-1) C\; R^2(\tau - \hat{\tau}) \operatorname{sinc}^2(f_{d,\kappa}\, N\, T_s) e^{j 2\pi f_{d,\kappa} N_\kappa T_s}$$

It can be observed that the phase of $m_{\Psi_\kappa} = E\{\Psi_\kappa\}$ is a function of the frequency deviation $f_{d,\kappa}$ with $$E\{\Psi_\kappa\} = |E\{\Psi_\kappa\}| e^{j 2\pi f_{d,\kappa} N_\kappa T_s}$$

The residual frequency deviation can therefore be estimated using the equation $$\hat{f}_{d,\kappa} = \frac{\arg(\Psi_\kappa)}{2\pi N_\kappa T_s} = \frac{\arg\left(\sum_{\mu = W_\kappa + 1}^{W_{\kappa+1}-1} s_\mu s_{\mu-1}^*\right)}{2\pi N_\kappa T_s}.$$

The frequency estimation method has two advantages over alternative methods. The first one is very low additional implementation complexity since it reuses correlation processing already performed. The additional required steps calculate the argument of the correlation result and feed it back to the down-conversion and despreading block 106. The second advantage is that the averaging functionality of the existing correlation procedure is utilized to reduce the probability of phase jumps that occur when the real or imaginary parts of the products $s_\mu \cdot s_{\mu-1}^*$ introduce sign changes due to added noise.

The intermediate correlation results $\Psi_\kappa$ are rotated towards the in-phase component before further accumulation thereof. The correlation phase is estimated as $$\hat{\phi}_\kappa = \arg(\Psi_\kappa) = \arg\left(\sum_{\mu = W_\kappa + 1}^{W_{\kappa+1}-1} s_\mu s_{\mu-1}^*\right),$$

and the final correlation result is calculated as $$Y = \sum_{\kappa=0}^{K-1} \sum_{\mu=W_\kappa}^{W_{\kappa+1}-1} s_\mu s_{\mu-1}^* e^{-j\hat{\phi}_\kappa}$$

with $s_{-1}=0$. Ideally, the inputs to block 122, as described hereinabove, are scalar values. However, in some implementations, the values produced by multiplier 120 may be complex values dependent on accuracy of delays and computation. Accordingly, the output of multiplier 120 is represented in FIG. 1 generally as a complex number. In an embodiment, the output of multiplier 120 can be a scalar value. The phase mismatch correction compensates sudden phase changes early in the observation period, when the frequency correction technique introduces strong fluctuations of the frequency deviation. It therefore achieves the same correlation gain within a shorter integration interval, which leads to lower energy consumption to perform the computation.

The expected value $m_Y$ of the correlation result Y can be derived as $$m_Y =$$

$$E\{Y\} = 2C\frac{R_0^2(\tau-\hat{\tau})}{N_0^2}\left[\sum_{\kappa=0}^{K-1}(M_\kappa-1)N_\kappa^2\mathrm{sinc}^2(f_{d,\kappa}N_\kappa T_s)e^{j2\pi f_{d,\kappa}N_\kappa T_s - j\hat{\phi}_\kappa} +\right.$$

$$\left.\sum_{\kappa=1}^{K-1}N_\kappa N_{\kappa-1}\mathrm{sinc}(f_{d,\kappa}N_\kappa T_s)\mathrm{sinc}(f_{d,\kappa-1}N_{\kappa-1}T_s)e^{j\pi(f_{d,\kappa}N_\kappa+f_{d,\kappa-1}N_{\kappa-1})T_s - j\hat{\phi}_\kappa}\right]$$

where $R_0^2(\tau-\hat{\tau})$ denotes the correlation function for the initial coherent integration number $N_0$. The derivation of the combined variance of the in-phase and quadrature components yields $$\sigma_Y^2 = E\{|Y - E\{Y\}|^2\} = \sum_{\kappa=0}^{K-1}(M_\kappa-1)\sigma_{w,\kappa}^4 + \sum_{\kappa=1}^{K-1}\sigma_{w,\kappa}^2\sigma_{w,\kappa-1}^2 +$$

$$2C\frac{R_0^2(\tau-\hat{\tau})}{N_0^2}\left[\sum_{\kappa=0}^{K-1}2(M_\kappa-1)\sigma_{w,\kappa}^2 N_\kappa^2\mathrm{sinc}^2(f_{d,\kappa}NT_s) +\right.$$

$$\left.\sum_{\kappa=0}^{K-2}\sigma_{w,\kappa}^2 N_{\kappa+1}^2\mathrm{sinc}^2(f_{d,\kappa+1}NT_s) + \sum_{\kappa=1}^{K-1}\sigma_{w,\kappa}^2 N_{\kappa-1}^2\mathrm{sinc}^2(f_{d,\kappa-1}NT_s)\right]$$

The maximum coherent integration period is inversely proportional to the maximum frequency deviation of the local oscillator. The higher the residual frequency deviation, the faster the signal phase rotates during the coherent integration process. The further the phase rotates during the coherent integration interval, the larger the sensitivity degradation will be when the samples are accumulated. The frequency-offset correction incrementally reduces the residual frequency deviation. It is therefore also possible to incrementally and progressively increase the coherent integration period while the correlation process is still ongoing. The integration technique is adaptively adjusted after the frequency correction has sufficiently converged. The adaptive integration technique increases the coherent integration period after the residual frequency deviation is sufficiently small. The reception sensitivity is thereby enhanced, since coherent integration provides a higher correlation gain than noncoherent integration.

If the frequency deviation again increases, the adaptive technique reduces the coherent integration interval. The initial intermediate correlation number $M_0$, that represents the number of terms initially summed in block 118, has to be large enough to provide sufficiently long observation periods for the initial frequency offset estimation. This improves the estimation accuracy. Furthermore, the coherent integration number $N_\kappa$ is only increased after the estimation of the frequency deviation has converged with sufficient accuracy. The next coherent integration number $N_{\kappa+1}$ is then calculated as $$N_{\kappa+1} = \begin{cases} N_{min}; & \left\lfloor\frac{1}{S\hat{f}_{d,\kappa}N_{min}T_s}\right\rfloor \le 1 \\ \left\lfloor\frac{1}{S\hat{f}_{d,\kappa}N_{min}T_s}\right\rfloor N_{min}; & 1 < \left\lfloor\frac{1}{S\hat{f}_{d,\kappa}N_{min}T_s}\right\rfloor < \frac{N_{max}}{N_{min}} \\ N_{max}; & \text{else} \end{cases}$$

The minimum coherent integration number $N_{min}$ is included to ensure that at least one full code cycle is used for correlation. It is set to 1 ms/Ts for GPS L1-C/A, and to 4 ms/Ts for Galileo E1-C. The notation "L1" refers to the roughly 1.5 GHz frequency band used by GPS, and "C/A" refers to the "coarse acquisition" positioning mode originally intended for civil, i.e., nonmilitary, use of the GPS system. The notation "E1-C" refers to the signal C of the Galileo E1 band, i.e., the pilot component of the Galileo open service signal in the E1/L1-band. The maximum coherent integration number $N_{max}$ limits the coherent integration interval to the expected coherence time of the propagation channel. It should be chosen according to the expected Doppler spread, which is influenced by the dynamics of receiver movement. The coherence time is a statistical measure of the time duration over which the propagation channel is essentially invariant. A reasonable value of the maximum coherent integration number $N_{max}$ for a static pedestrian receiver is 100 ms/Ts. The coherent integration number $N_\kappa$ is only increased if the estimated frequency deviation is smaller than, for example and without limitation, a quarter of the estimation range. Otherwise, the coherent integration period is decreased again. This case could happen for large estimation errors, or if the frequency deviation varies due to fast receiver movement. This generous back-tracking property leads to a quick recovery from such situations. In order to keep the total intermediate observation time $M_\kappa \cdot N_\kappa \cdot T_s$ for the frequency offset estimation stable, the intermediate correlation number is set to $$M_{\kappa+1} = \begin{cases} 2; & \left\langle\frac{M_0 N_0}{N_{\kappa+1}}\right\rangle \le 2 \\ \left\langle\frac{M_0 N_0}{N_{\kappa+1}}\right\rangle; & \text{else,} \end{cases}$$

The sensitivity improvement of a Galileo/GPS receiver architecture with adaptive correlation as illustrated in FIG. 1 has been verified by extensive simulations.

The correlation result Y is ideally a scalar parameter. However, the adaptive correlation result might be complex valued as previously described. In order to estimate the unknown code phase of the received signal, a real-valued decision statistic can be formed to eliminate an imaginary component of the adaptive correlation result Y. A complex-valued variable with unknown phase and additive zero-mean complex-valued white Gaussian noise can be detected with a magnitude or squared magnitude statistic such as the squared magnitude decision statistic $\Lambda$:

$$\Lambda = |\Upsilon|^2 = \left| \sum_{\kappa=0}^{K-1} \sum_{\mu=W_\kappa}^{W_{\kappa+1}-1} s_\mu s_{\mu-1}^* e^{-j\hat{\phi}_\kappa} \right|^2.$$

The decision statistic obeys the non-central Chi-squared cumulative distribution $$P_\Lambda(\Lambda) \simeq 1 - Q_1\left( \sqrt{\frac{2|m_\Upsilon|^2}{\sigma_\Upsilon^2}}, \sqrt{\frac{2\Lambda}{\sigma_\Upsilon^2}} \right)$$

where $Q_1(,)$ is the first-order Marcum-Q function.

In order to prevent false acquisition due to out-of-phase autocorrelation and cross-correlation, the decision statistic is required to exceed a certain threshold for hypotheses $H_0$ and $H_1$ with $$\Lambda \underset{H_0}{\overset{H_1}{\gtrless}} \lambda$$

Hypothesis $H_1$ represents the case where the estimated code phase corresponds to the actual code phase. Hypothesis $H_0$ represents the out-of-phase correlation, and is assumed if the correlation result does not exceed the threshold. Satellite navigation receivers typically utilize the Neyman-Pearson statistical decision criterion, which maximizes the probability of detection $P_d$ for a given false detection probability $P_f$. The probability of false detection $$P_f = Pr\{\Lambda \geq \lambda \mid H_0\} = 1 - P_{\Lambda|H_0}(\lambda) = Q_1\left( \sqrt{\frac{2|m_{\Upsilon,H_0}|^2}{\sigma_{\Upsilon,H_0}^2}}, \sqrt{\frac{2\lambda}{\sigma_{\Upsilon,H_0}^2}} \right)$$

with $$m_{\Upsilon,H_0} = m_\Upsilon|_{R^2(\tau-\hat{\tau})=R_m^2}, \sigma_{\Upsilon,H_0}^2 = \sigma_\Upsilon^2|_{R^2(\tau-\hat{\tau})=R_m^2}$$

is the probability that the maximum out-of-phase autocorrelation value $R_m$ leads to a false detection. The maximum out-of-phase autocorrelation values for zero frequency deviation are $R_m=65N/1023$ for GPS L1-C/A, and $R_m=0.094$ N for Galileo E1-C. A single-shot positioning receiver calculates position based on estimated code phases and assistance data after signal acquisition. Assistance data is data supplied from another source, for example and without limitation, data providing or referencing the digital content of a received signal such as a satellite ephemeris or identification numbers of satellites that are in view. Assistance data may include data such as that defined in the A-GPS protocols by the 3GPP ("Third Generation Partnership Program"), the parallel American/Asian 3GPP2 program, or the OMA ("Open Mobile Alliance") of the cellular telephone industry. False acquisition may thus result in large positioning errors. Single-shot receivers therefore typically require a lower false detection probability $P_f$ per code phase search bin than a conventional tracking receiver. Experience indicates that $P_f=10^{-5}$ offers a good trade-off for highly parallel correlation engines, which calculate several 10,000 correlation results simultaneously. The probability of a false detection for a complete search is the false detection probability per search bin times the total number of search bins. The optimal detection threshold $$\lambda = P_{\Lambda|H_0}^{-1}(1 - P_f) = \frac{\sigma_{\Upsilon,H_0}^2}{2}\left[ Q_{1,\beta}^{-1}\left( \sqrt{\frac{2|m_{\Upsilon,H_0}|^2}{\sigma_{\Upsilon,H_0}^2}}, P_f \right) \right]^2$$

equals the inverse cumulative distribution of $\Lambda$ for the false-detection hypothesis, which can be obtained with the inverse first-order Marcum-Q function with respect to its second argument $Q^{-1}_{1,\beta}(,)$. The inverse Marcum-Q function can be solved by numerical methods using techniques well known in the art. In order to fully leverage the potential of enhanced sensitivity for Galileo/GPS reception in highly dynamic environments, a technique to adaptively adjust the detection threshold may be utilized. It optimally adjusts the detection threshold in response to the received signal strength in order to make full use of the maximum acceptable false detection probability. The method estimates the variance of the correlation result and its mean magnitude under hypothesis $H_0$, and calculates the detection threshold. The estimation algorithm relies on the highly parallel correlation architectures for single-shot positioning which calculate several thousand correlation results for different code delay bins. The large number of code delay bins provides a sufficient statistic to obtain the first and second moments of the correlation result. The result is a higher detection threshold for line-of-sight signals than for attenuated signals.

The probability of detection $P_d$ represented by the equation:

$$P_d = Pr\{\Lambda \geq \lambda \mid H_1\} = 1 - P_{\Lambda|H_1}(\lambda) = Q_1\left( \sqrt{\frac{2|m_{\Upsilon,H_1}|^2}{\sigma_{\Upsilon,H_1}^2}}, \sqrt{\frac{2\lambda}{\sigma_{\Upsilon,H_1}^2}} \right)$$

with $$m_{\Upsilon,H_1} = m_\Upsilon|_{R^2(\tau-\hat{\tau})=N^2}, \sigma_{\Upsilon,H_1}^2 = \sigma_\Upsilon^2|_{R^2(\tau-\hat{\tau})=N^2}$$

is the probability that the decision statistic $\Lambda$ is above the detection threshold $\lambda$ when the estimated code phase equals the actual code phase.

Reception sensitivity for the adaptive integration technique introduced herein versus observation time $T_1$ (in seconds) is illustrated in FIGS. 2A-2D for GPS L1-C/A in FIGS. 2A and 2C, and for Galileo E1-C in FIGS. 2B and 2D. Particular receiver parameters are illustrated in the figures. The figures illustrate reception sensitivity as carrier/noise power spectral density ("PSD") in dBHz for $T_0=290°$ K., F=3 dB, $M_0=T_I/(10 N_0 \cdot T_s)$, $N_{min,\ GPS}=1$ ms/$T_s$, $N_{min,\ Galileo}=4$ ms/$T_s$, $N_{max} \cdot T_s=100$ ms, $P_f=10^{-5}$, and $P_d=90\%$. Recall that the parameter $M_0$ is the initial intermediate correlation value for the summation limit M illustrated in FIG. 1, and $P_f$ is the false detection probability per code phase search bin. The choice of the receiver parameters in FIG. 2 are typical values. The figures show the minimum carrier-to-noise PSD $C_1/N_0$ where a 90% probability of detection can be maintained. The choice of $M_0=T_I/(10 N_0 T_s)$, where $$T_t = \sum_{\kappa=0}^{K-1} M_\kappa N_\kappa T_s$$

is the total observation period, allows for a long initial intermediate correlation interval to estimate the frequency deviation with sufficient accuracy. The values for the product $N_0 \cdot T_s$ in the legend of each plot are the initial coherent integration periods that are incrementally increased as introduced herein when the initial frequency offset $f_d$ is reduced with the frequency offset correction. The minimum values $N_{min}$ are chosen such that the coherent integration period covers exactly one spreading code period. The limit for the maximum coherent integration periods is $N_{max} \cdot T_s = 100$ ms. This value corresponds to a reasonable coherence time for a static pedestrian receiver. While longer coherent integration periods would yield even better sensitivity, limiting the integration period provides higher receiver robustness that is desired in practical applications.

The sensitivity gain versus observation time $T_t$ (in seconds) of the adaptive correlation technique, introduced herein, expressed in dB versus state-of-the-art noncoherent integration is illustrated in FIGS. 3A-3D for $T_0 = 290°$ K., F=3 dB, $M_0 = T_t/(10 N_0 T_s)$, $N_{min, GPS} = 1$ ms/$T_s$, $N_{min, Galileo} = 4$ ms/$T_s$, $N_{max} \cdot T_s = 100$ ms, $P_f = 10^{-5}$, and $P_d = 90\%$. The adaptive correlation technique provides sensitivity improvement as illustrated in FIGS. 3A-3D up to 9.3 dB. For the case of the lower frequency deviations illustrated in FIGS. 3A and 3B, the shortest initial coherent integration interval $N_0 \cdot T_s$ delivers the largest sensitivity gain since the maximum integration interval is limited to $N_{max} \cdot T_s = 100$ ms. The smallest initial value of the coherent integration interval has the greatest increment opportunity and hence achieves the largest improvement. The longer initial coherent integration intervals saturate earlier. For the cases of the large frequency deviations in FIGS. 3C and 3D, the initial coherent integration interval $N_0 \cdot T_s = 4$ ms delivers the largest sensitivity gain. The reason for the large sensitivity gain lies in the backtracking property of the adaptive integration algorithm. The coherent integration number $N_\kappa$ is decreased if the estimated frequency deviation is larger than a quarter of the estimation range. The generous backtracking property leads to quick recovery from large frequency deviations if there is room for decreasing the coherent integration interval. This is not the case for $N_0 \cdot T_s = 1$ ms, which in FIG. 3C therefore delivers slightly less sensitivity gain than $N_0 \cdot T_s = 4$ ms. Nonetheless, the shortest initial coherent integration interval still delivers the largest frequency search bin, and the adaptive integration interval does not affect the size of the frequency search bin.

The concept has thus been introduced of employing a coherent integration stage to coherently integrate a signal such as a received signal, such as a CDMA signal, in a receiver over a first period of integration to produce a pre-detection sample by using a downconversion signal having a downconversion frequency. A phase error detection stage employs a phase error of the pre-detection sample to produce a phase error signal. A correction stage employs the phase error signal to produce a downconversion frequency adjustment signal in response to the phase error signal. Thus, an adjustment signal is produced in a feedback process to correct a downconversion frequency such as a frequency of a local oscillator. These processes enable production of a receiver that may be used to acquire a received signal in a low signal-to-noise ratio environment. In an embodiment, the receiver is a global navigation satellite system receiver such as a GPS or Galileo receiver.

In an embodiment, the phase error detection stage is configured to delay a plurality of the pre-detection samples, form a complex conjugate of the plurality of the delayed pre-detection samples, form a sum of products over a second period of integration of the plurality of the pre-detection samples with the plurality of the delayed and complex conjugated pre-detection samples, and produce the phase error signal dependent on an angular coordinate of the sum of products. In an embodiment, the delayed pre-detection samples of the plurality of delayed pre-detection samples are each delayed by the first period of integration of the coherent integration stage.

In an embodiment, the receiver further includes a detection stage coupled to the coherent integration stage that employs the pre-detection sample to produce a decision statistic. In an embodiment, a sequence of magnitudes is formed in the detection stage from the sum of products, and the sequence of magnitudes is summed to form the decision statistic. In an embodiment, the summed sequence of magnitudes is squared to form the decision statistic.

In an embodiment, the correction stage is configured to adjust at least one of a duration of the first period of integration and a duration of the second period of integration employing the phase error signal.

In a further embodiment, a baseband signal downconverter stage configured to produce a downconverted baseband signal using the downconversion frequency and a despreading code.

In a further exemplary embodiment, a receiver comprising a coherent integration stage is configured to coherently integrate a received signal over a first period of integration to produce a pre-detection sample, wherein the pre-detection sample is employed to adjust a duration of the first period of integration during acquisition of the received signal. In an embodiment, the receiver is a global positioning system receiver. In an embodiment, the received signal is a CDMA signal.

In an embodiment, the receiver is further configured to delay a plurality of the pre-detection samples, form a complex conjugate of the plurality of the delayed pre-detection samples, form a sum of products over a second period of integration of the plurality of the pre-detection samples with the plurality of the delayed and complex conjugated pre-detection samples, and produce a phase error signal dependent on an angular coordinate of the sum of products. The phase error signal is employed to adjust the first period of integration during the acquisition of the received signal. In an embodiment, the delayed pre-detection samples of the plurality of delayed pre-detection samples are each delayed by the first period of integration of the coherent integration stage.

In a further embodiment, a detection stage configured to produce a decision statistic employing the pre-detection sample is coupled to the coherent integration stage. In an embodiment, a sequence of magnitudes is formed in the detection stage from the sum of products, and the sequence of magnitudes is summed to form the decision statistic. In an embodiment, the summed sequence of magnitudes is squared to form the decision statistic.

In an embodiment, the receiver is further configured to adjust at least one of the first period of integration and the second period of integration employing the phase error signal.

In a further embodiment, the receiver includes a baseband signal downconverter stage configured to produce a downconverted baseband signal using a downconversion signal having a downconversion frequency. The downconverted baseband signal is produced from the received signal, and the pre-detection sample is used to adjust the downconversion frequency. In an embodiment, the baseband signal downconverter stage is combined with a despreading stage.

Another exemplary embodiment provides a method of processing a received signal. In an embodiment, the method includes integrating a signal downconverted by a downconversion frequency over a first period of coherent integration to produce a pre-detection sample. The method includes producing a phase error signal dependent on a phase error of the pre-detection sample, and producing a downconversion frequency adjustment signal in response to the phase, error signal. In an embodiment, the method further includes producing a decision statistic employing the pre-detection sample, wherein producing the decision statistic includes delaying a plurality of the pre-detection samples, forming a complex conjugate of the plurality of the delayed pre-detection samples, forming a sum of products over a second period of integration of the plurality of the pre-detection samples with the plurality of the delayed and complex conjugated pre-detection samples, and producing the phase error signal dependent on an angular coordinate of the sum of products. In an embodiment, the delayed pre-detection samples of the plurality of delayed pre-detection samples are each delayed by the first period of integration of the coherent integration stage. In an embodiment, the method further includes forming a sequence of magnitudes from the sum of products, and summing the sequence of magnitudes to form the decision statistic. In an embodiment, the method further includes adjusting at least one of a duration of the first period of integration and a duration of the second period of integration employing the phase error signal.

A further exemplary embodiment provides a method of integrating a signal in a receiver over a first period of coherent integration to produce a pre-detection sample, and adjusting a duration of the first period of integration during acquisition of the received signal employing the pre-detection sample. In an embodiment, the method further includes producing a decision statistic employing the pre-detection sample, delaying a plurality of the pre-detection samples, forming a complex conjugate of the plurality of the delayed pre-detection samples, forming a sum of products over a second period of integration of the plurality of the pre-detection samples with the plurality of the delayed and complex conjugated pre-detection samples, producing a phase error signal dependent on an angular coordinate of the sum of products, and employing the phase error signal to adjust the first period of integration during the acquisition of the received signal. In an embodiment, the delayed pre-detection samples of the plurality of delayed pre-detection samples are each delayed by the first period of integration of the coherent integration stage. In an embodiment, the method further includes forming a sequence of magnitudes in the detection stage from the sum of products, and summing the sequence of magnitudes to form the decision statistic. In an embodiment, the method further includes adjusting at least one of the first period of integration and the second period of integration employing the phase error signal. In an embodiment, the method further includes producing a downconverted baseband signal using a downconversion signal having a downconversion frequency, employing the pre-detection sample to adjust the downconversion frequency, and employing a despreading code to demodulate the signal.

Although processes to detect a received signal in a low signal-to-noise ratio environment and related methods have been described for application to a GPS or Galileo receiver, it should be understood that other applications of these processes such as for other RF signal receivers are contemplated within the broad scope of the invention, including signals that may or may not be CDMA signals, and need not be limited to GPS or Galileo applications employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A receiver, comprising:
   a coherent integration stage configured to coherently integrate a signal downconverted using a downconversion frequency, wherein the coherent integration is performed over a first period of integration to produce a pre-detection sample;
   a phase error detection stage coupled to an output of the coherent integration stage, the phase error detection stage configured to produce a phase error signal representing a phase error of the pre-detection sample;
   a detection stage coupled to the output of the phase error detection stage, the detection stage configured to produce a decision statistic employing the pre-detection sample, wherein the decision statistic is compared to a threshold to prevent false acquisition; and
   a correction stage coupled to the output of the phase error detection stage, the correction stage configured to output a downconversion frequency adjustment signal in response to the phase error signal, wherein the phase error detection stage is configured
   to delay a plurality of the pre-detection samples,
   to form a complex conjugate of the plurality of the delayed pre-detection samples,
   to form a sum of products over a second period of integration of the plurality of the pre-detection samples with the plurality of the delayed and complex conjugated pre-detection samples, and
   to produce the phase error signal dependent on an angular coordinate of the sum of products.

2. The receiver as claimed in claim 1, wherein a signal received by the receiver is a CDMA signal.

3. The receiver as claimed in claim 1, wherein the delayed pre-detection samples of the plurality of delayed pre-detection samples are each delayed by the first period of integration of the coherent integration stage.

4. The receiver as claimed in claim 1, wherein a sequence of magnitudes is formed in the detection stage from the sum of products, and the sequence of magnitudes is summed to form the decision statistic.

5. The receiver as claimed in claim 1, wherein the correction stage is configured to adjust at least one of a duration of the first period of integration and a duration of the second period of integration employing the phase error signal.

6. The receiver as claimed in claim 1, further comprising a baseband signal downconverter stage configured to produce a downconverted baseband signal using the downconversion frequency and a despreading code.

7. A receiver comprising:
a coherent integration stage configured to coherently integrate a received signal over a first period of integration to produce a pre-detection sample, wherein the pre-detection sample is employed to adjust a duration of the first period of integration during acquisition of the received signal; and
a detection stage coupled to an output of the coherent integration stage, the detection stage configured to produce a decision statistic employing the pre-detection sample, wherein the receiver is further configured
to delay a plurality of the pre-detection samples,
to form a complex conjugate of the plurality of the delayed pre-detection samples,
to form a sum of products over a second period of integration of the plurality of the pre-detection samples with the plurality of the delayed and complex conjugated pre-detection samples,
to produce a phase error signal dependent on an angular coordinate of the sum of products, wherein the phase error signal is employed to adjust the first period of integration during the acquisition of the received signal, and
to compare the decision statistic to a threshold to prevent false acquisition.

8. The receiver as claimed in claim 7, wherein the delayed pre-detection samples of the plurality of delayed pre-detection samples are each delayed by the first period of integration of the coherent integration stage.

9. The receiver as claimed in claim 7, wherein a sequence of magnitudes is formed in the detection stage from the sum of products, and the sequence of magnitudes is summed to form the decision statistic.

10. The receiver as claimed in claim 7, wherein the receiver is further configured to adjust at least one of the first period of integration and the second period of integration employing the phase error signal.

11. The receiver as claimed in claim 7, further comprising a baseband signal downconverter stage, the baseband signal downconverter stage configured to produce a downconverted baseband signal using a downconversion signal having a downconversion frequency, wherein the downconverted baseband signal comprises the received signal, and wherein the pre-detection sample is further used to adjust the downconversion frequency.

12. A method of processing a received signal, the method comprising:
integrating a signal downconverted by a downconversion frequency over a first period of coherent integration to produce a pre-detection sample;
producing a phase error signal dependent on a phase error of the pre-detection sample;
producing a decision statistic employing the pre-detection sample;
comparing the statistic to a threshold to prevent false acquisition; and
producing a downconversion frequency adjustment signal in response to the phase error signal, wherein producing the decision statistic comprises:
delaying a plurality of the pre-detection samples;
forming a complex conjugate of the plurality of the delayed pre-detection samples;
forming a sum of products over a second period of integration of the plurality of the pre-detection samples with the plurality of the delayed and complex conjugated pre-detection samples; and
producing the phase error signal dependent on an angular coordinate of the sum of products.

13. The method as claimed in claim 12, wherein the delayed pre-detection samples of the plurality of delayed pre-detection samples are each delayed by the first period of coherent integration.

14. The method as claimed in claim 12, further comprising forming a sequence of magnitudes from the sum of products, and summing the sequence of magnitudes to form the decision statistic.

15. The method as claimed in claim 12, further comprising adjusting at least one of a duration of the first period of integration and a duration of the second period of integration employing the phase error signal.

16. A method of processing a signal in a receiver, the method comprising:
integrating the signal over a first period of coherent integration to produce a pre-detection sample;
adjusting a duration of the first period of integration during acquisition of the received signal employing the pre-detection sample;
producing a decision statistic employing the pre-detection sample;
comparing the decision statistic to a threshold to prevent false acquisition;
delaying a plurality of the pre-detection samples;
forming a complex conjugate of the plurality of the delayed pre-detection samples;
forming a sum of products over a second period of integration of the plurality of the pre-detection samples with the plurality of the delayed and complex conjugated pre-detection samples;
producing a phase error signal dependent on an angular coordinate of the sum of products; and
employing the phase error signal to adjust the first period of integration during the acquisition of the received signal.

17. The method as claimed in claim 16, wherein the delayed pre-detection samples of the plurality of delayed pre-detection samples are each delayed by the first period of integration of the coherent integration.

18. The method as claimed in claim 16, further comprising:
forming a sequence of magnitudes in a detection stage from the sum of products; and
summing the sequence of magnitudes to form the decision statistic.

19. The method as claimed in claim 16, further comprising adjusting at least one of the first period of integration and the second period of integration employing the phase error signal.

20. The method as claimed in claim 16, further comprising:
producing a downconverted baseband signal using a downconversion signal having a downconversion frequency;
employing the pre-detection sample to adjust the downconversion frequency; and
employing a despreading code to demodulate the signal.

* * * * *